United States Patent
Ng et al.

(10) Patent No.: US 11,043,961 B2
(45) Date of Patent: Jun. 22, 2021

(54) ANALOG-TO-DIGITAL CONVERTER AND ASSOCIATED CHIP

(71) Applicant: SHENZHEN GOODIX TECHNOLOGY CO., LTD., Guangdong (CN)

(72) Inventors: Si Herng Ng, Guangdong (CN); Wen-Chi Wang, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/985,115

(22) Filed: Aug. 4, 2020

(65) Prior Publication Data
US 2020/0366313 A1 Nov. 19, 2020

Related U.S. Application Data

(63) Continuation of application No. PCT/CN2019/077811, filed on Mar. 12, 2019.

(51) Int. Cl.
*H03M 3/00* (2006.01)

(52) U.S. Cl.
CPC ........... *H03M 3/464* (2013.01); *H03M 3/422* (2013.01); *H03M 3/462* (2013.01)

(58) Field of Classification Search
CPC ........ H03M 3/454; H03M 3/424; H03M 3/43; H03M 3/464; H03M 3/452; H03M 3/458;
(Continued)

(56) References Cited

U.S. PATENT DOCUMENTS 6,603,415 B1 * 8/2003 Somayajula ........ H03M 1/0809
326/94
6,674,381 B1 1/2004 Gomez et al.
(Continued)

FOREIGN PATENT DOCUMENTS

CN 102647187 A 8/2012
CN 103762982 A 4/2014
(Continued)

OTHER PUBLICATIONS

English Abstract Translation of CN102647187A.
(Continued)

*Primary Examiner* — Linh V Nguyen
(74) *Attorney, Agent, or Firm* — WPAT, P.C., Intellectual Property Attorneys; Anthony King

(57) ABSTRACT

The present application discloses an ADC (10). The ADC has an A/D conversion operation mode and a measurement operation mode. The ADC includes an input terminal (100), a DAC (104), and an output terminal (102). The input terminal is configured to receive an analog signal. The output terminal is configured to output a digital signal. The DAC includes a plurality of D/A conversion units. When the ADC operates in the A/D conversion operation mode, the ADC is configured to convert the analog signal into the digital signal, and when the ADC operates in the measurement operation mode, the digital signal related to a ratio of a capacitance of the D/A conversion unit to be measured to a total capacitance of the plurality of D/A conversion units.

12 Claims, 7 Drawing Sheets

(58) Field of Classification Search
CPC ...... H03M 3/368; H03M 3/456; H03M 3/502; H03M 3/496; H03M 1/74; H03M 1/804; H03M 3/34; H03M 3/39; H03M 3/324; H03M 3/342
USPC .......... 341/118–120, 143, 155, 172
See application file for complete search history.

(56) References Cited

U.S. PATENT DOCUMENTS

| | | | | |
|---|---|---|---|---|
| 7,564,389 | B1* | 7/2009 | Byrd | H03M 3/39 |
| | | | | 341/143 |
| 9,432,049 | B2* | 8/2016 | Katayama | H03M 3/496 |
| 2002/0180629 | A1* | 12/2002 | Liu | H03M 3/42 |
| | | | | 341/143 |
| 2003/0210166 | A1* | 11/2003 | Liu | H03M 3/34 |
| | | | | 341/172 |
| 2007/0285296 | A1 | 12/2007 | Bihan | |
| 2008/0062022 | A1* | 3/2008 | Melanson | H03M 3/464 |
| | | | | 341/143 |
| 2009/0085784 | A1* | 4/2009 | Di Giandomenico | |
| | | | | H03M 1/1033 |
| | | | | 341/141 |
| 2009/0184857 | A1* | 7/2009 | Furuta | H03M 1/164 |
| | | | | 341/156 |
| 2014/0022102 | A1* | 1/2014 | Cho | H03M 3/384 |
| | | | | 341/120 |
| 2014/0253355 | A1* | 9/2014 | Quiquempoix | H03M 1/0665 |
| | | | | 341/143 |
| 2014/0368365 | A1* | 12/2014 | Quiquempoix | H03M 3/30 |
| | | | | 341/143 |
| 2015/0102951 | A1* | 4/2015 | Watanabe | H03M 3/422 |
| | | | | 341/143 |
| 2019/0131989 | A1* | 5/2019 | Maurino | H03M 3/342 |

FOREIGN PATENT DOCUMENTS

| | | |
|---|---|---|
| CN | 104168023 A | 11/2014 |
| CN | 104320140 A | 1/2015 |
| CN | 104954018 A | 9/2015 |
| CN | 104954018 A | 9/2015 |

OTHER PUBLICATIONS

English Abstract Translation of CN104320140A.
English Abstract Translation of CN104954018A.
English Abstract Translation of Foreign Reference CN103762982.
English Abstract Translation of Foreign Reference CN104954018.
International Searching Authority (ISA) Form 210—International Search Report of PCT/CN2019/077811.
International Searching Authority (ISA) Form 220—Notification of Transmittal of the International Search Report of PCT/CN2019/077811.
International Searching Authority (ISA) Form 237—Written Opinion of PCT/CN2019/077811.
As-filed PCT Request of PCT/CN2019/077811.
As-filed PCT Application of PCT/CN2019/077811.
Notification of Receipt of Search Copy in Chinese (Form PCT/ISA/202) of PCT/CN2019/077811.

* cited by examiner

ANALOG-TO-DIGITAL CONVERTER AND ASSOCIATED CHIP

CROSS-REFERENCE TO RELATED APPLICATIONS

This application is a continuation of International Application No. PCT/CN2019/077811, filed on Mar. 12, 2019, the disclosure of which is hereby incorporated by reference in its entirety.

TECHNICAL FIELD

The present application relates to a converter; in particular, to an analog-to-digital converter and an associated chip.

BACKGROUND

The digital-to-analog (D/A) converters of the Δ-Σ analog-to-digital converter (ADC) have mismatch errors among the multiple D/A conversion units, thereby causing the performance of the delta-sigma ADC to decrease. The above problem can be solved by correcting the mismatch errors between the multiple D/A conversion units. Nevertheless, in order to perform such correction, the relative sizes between the multiple D/A conversion units need to be measured first. However, the prior technology must introduce a large number of additional circuit components to measure the relative sizes between multiple D/A conversion units, which in turn leads to increased design difficulty and increased hardware cost. In view of the foregoing, the present application further improves and innovates the method for measuring the relative sizes between multiple D/A conversion units to address the above-mentioned issue.

SUMMARY OF THE INVENTION

One of the objectives of the present application is to disclose a data converter; in particular, an ADC and an associated chip, to address the above-mentioned issue.

One embodiment of the present application discloses an analog-to-digital converter (ADC), having an analog-to-digital (A/D) conversion operation mode and a measurement operation mode, wherein the ADC includes: an input terminal, configured to receive an analog signal; an output terminal, configured to output a digital signal; a digital-to-analog (DAC), comprising a plurality of digital-to-analog (D/A) conversion units respectively having a unit input terminal and a unit output terminal, wherein the unit output terminals of the plurality of D/A conversion units are coupled to one another, and the plurality of D/A conversion units generates an output signal according to the unit input terminals of the plurality of D/A conversion units; an input path selection module, coupled between the input terminal and the DAC, wherein when the ADC operates in the A/D conversion operation mode, the input path selection module couples each unit input terminal of the plurality of D/A conversion units with the input terminal to receive the analog signal, and when the ADC operates in the measurement operation mode, the input path selection module couples the unit input terminal of a D/A conversion unit to be measured among the plurality of D/A conversion units to a first reference voltage, and couples the unit input terminals of the other D/A conversion units among the plurality of D/A conversion units to a second reference voltage; and a processing circuit, coupled between the DAC and the output terminal, wherein the processing circuit is configured to generate the digital signal according to the output signal; wherein when the ADC operates in the A/D conversion operation mode, the ADC is configured to convert the analog signal into the digital signal, and when the ADC operates in the measurement operation mode, the digital signal is related to a ratio of a capacitance of the D/A conversion unit to be measured to a total capacitance of the plurality of D/A conversion units.

One embodiment of the present application discloses a chip. The chip includes the above ADC.

The ADC and the associated chip disclosed in the present application are able to measure the ratio of the capacitance of each of the plurality of D/A conversion units to a total capacitance of the plurality of D/A conversion units, and therefore, is capable of correcting the mismatch errors among the plurality of D/A conversion units, thereby increasing the performance of the ADC.

DETAILED DESCRIPTION

Figure 1:
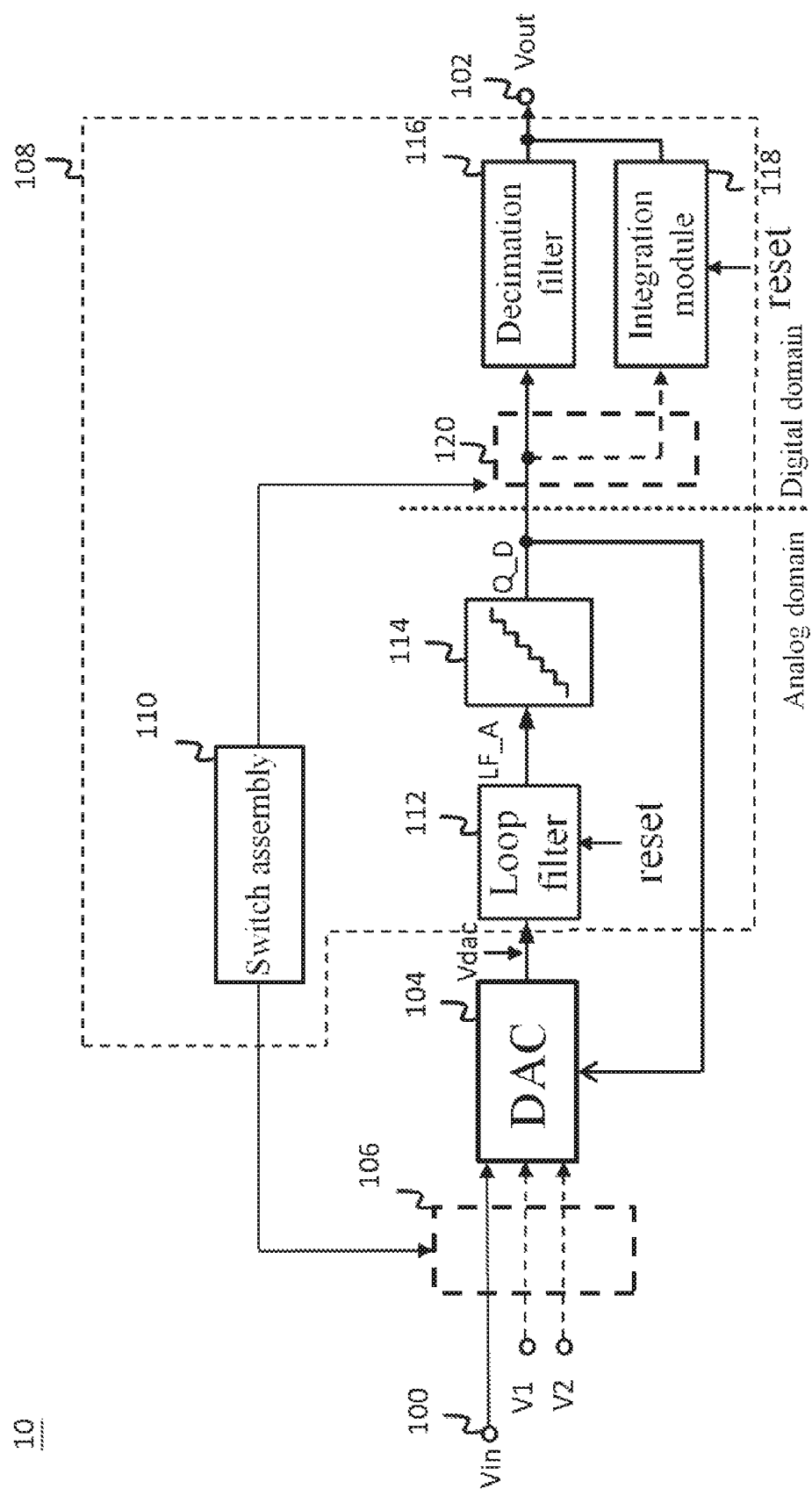
FIG. 1 is a schematic block diagram illustrating the Δ-Σ ADC operating in the A/D conversion operation mode according to an embodiment of the present application.

The following disclosure provides many different embodiments, or examples, for implementing different features of the invention. Specific examples of components and arrangements are described below to simplify the present disclosure. As could be appreciated, these are, of course, merely examples and are not intended to be limiting. For example, the formation of a first feature over or on a second feature in the description that follows may include embodiments in which the first and the second features are formed in direct contact, and may also include embodiments in which additional features may be formed between the first and the second features, such that the first and the second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for the ease of the description to describe one element or feature's relationship with respect to another element(s) or feature(s) as illustrated in the drawings. The spatially relative terms are intended to encompass different orientations of the device in use or operation in addition to the orientation depicted in the figures. The apparatus may be otherwise oriented (e.g., rotated by 90 degrees or at other orientations) and the spatially relative descriptors used herein may likewise be interpreted accordingly.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. As could be appreciated, other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

In conventional circuit frameworks for measuring the D/A conversion units, additional signal sources, resistors and voltage measuring circuit are required to measure the capacitance of the capacitors of the D/A conversion units. The Δ-Σ ADC of the present disclosure can be configured as an incremental Δ-Σ ADC, which may obtain the capacitor information of the D/A conversion units therein in a way that can hardly affect the operation of the Δ-Σ ADC in the A/D conversion operation mode.

Figure 2:
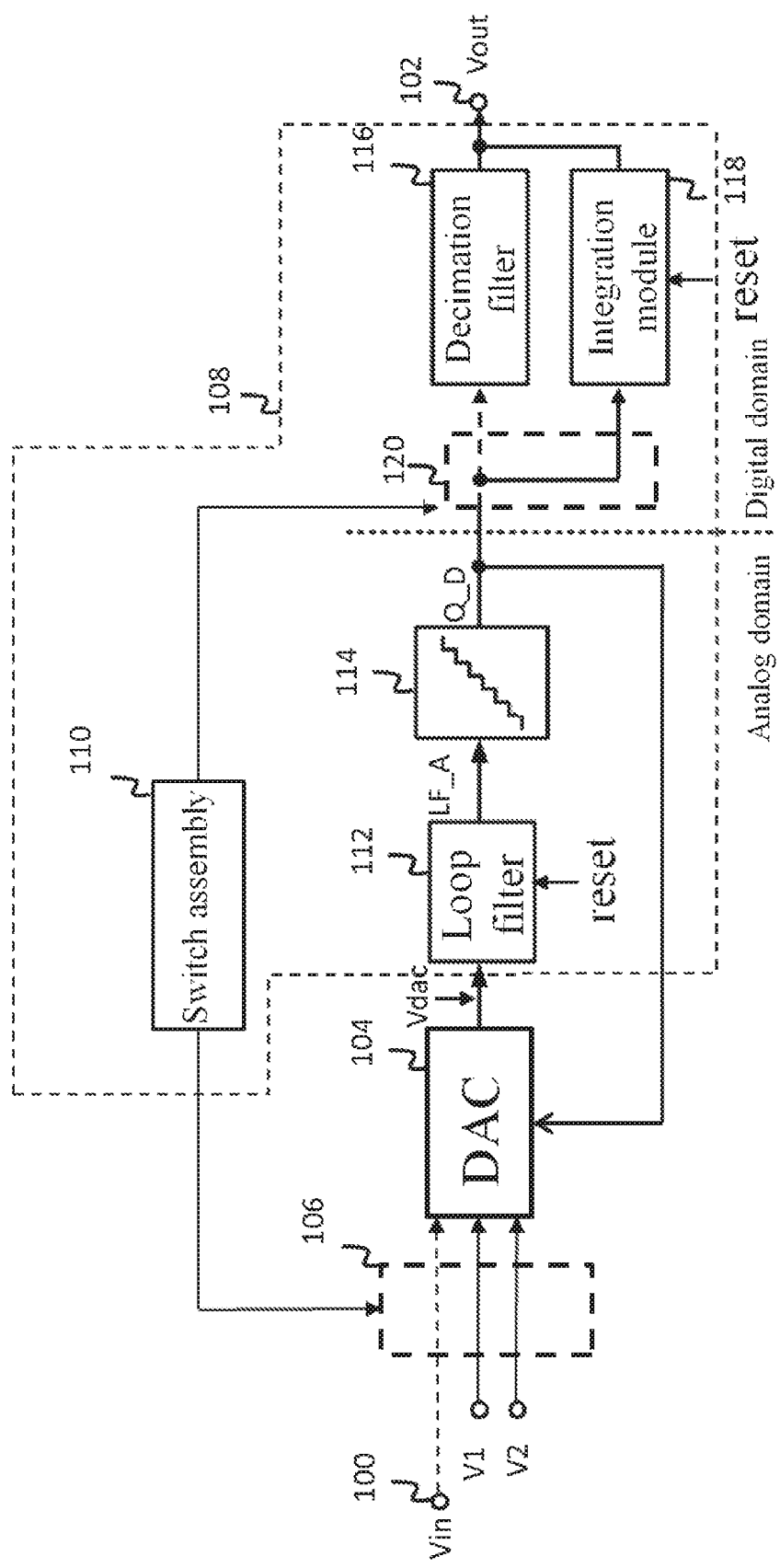
FIG. 2 is a schematic block diagram relative to FIG. 1 and illustrating the Δ-Σ ADC operating in the measurement operation mode according to an embodiment of the present application.

FIG. 1 and FIG. 2 are schematic block diagrams illustrating a Δ-Σ (delta-sigma) ADC 10 according to the present application, wherein the Δ-Σ ADC 10 in FIG. 1 operates in an A/D conversion operation mode, whereas the Δ-Σ ADC 10 in FIG. operates in a measurement operation mode. Specifically, the A/D conversion operation mode is configured to convert the inputted analog signal Vin into a digital signal Vout under general circumstances, whereas the measurement operation mode is configured to evaluate the mismatch errors among a plurality of assemblies (e.g., capacitors) of the Δ-Σ ADC 10 in unusual circumstances, such as when leaving the factory or powering on, and the evaluation results thus obtained is further configured to correct the accuracy of the Δ-Σ ADC 10 in the A/D conversion operation mode.

Figure 3:
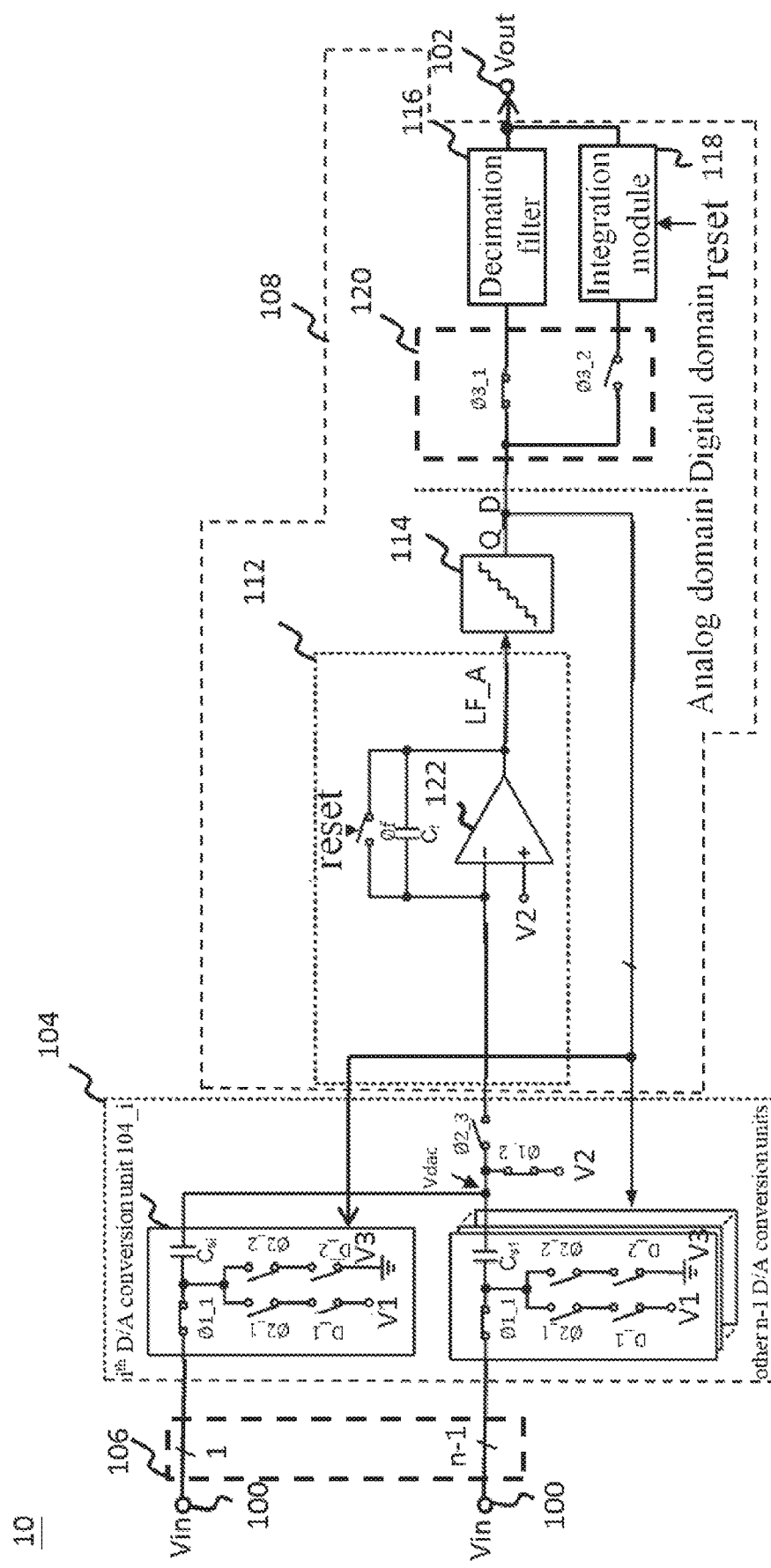
FIG. 3 is a circuit diagram illustrating an embodiment wherein the Δ-Σ, ADC of FIG. 1 operates in a first stage of the A/D conversion operation mode.

Referring to FIG. 1, the Δ-Σ ADC 10 includes an input terminal 100, an output terminal 102, a DAC 104, an input path selection module 106, and a processing circuit 108 configured from a switch assembly 110, a loop filter 112, a quantizer 114, a decimation filter 116, an integration module 118, and an output path selection module 120. The DAC 104 includes a plurality of D/A conversion units 104_1, 104_2, 104_i, . . . 140_n (as shown in FIG. 3), wherein n is a positive integer; in the present embodiment, n is greater than 1. Each of the plurality of D/A conversion units 104_1, 104_2, . . . , 104_i, . . . 140_n has a unit input terminal and a unit output terminal, wherein the unit output terminals of the plurality of D/A conversion units 104_1, 104_2, . . . 104_i, . . . 140_n are coupled to one another, and the plurality of D/A conversion units 104_1, 104_2, . . . 104_i, . . . 140_n generate an output signal Vdac according to the unit input terminals of the plurality of D/A conversion units 104_1, . . . 104_2, . . . 104_i, . . . 140_n.

The input terminal 100 is configured to receive an analog signal Vin. The input path selection module 106 is coupled between the input terminal 100 and the DAC 104 and is under the control of the switch assembly 110, so that the input terminal 100 configured such that it is coupled to the DAC 104, which is shown as the solid line between the two, and the input path selection module 106 is configured such that the electric connection between the first reference voltage V1 and the second reference voltage V2 and the DAC 104 is interrupted, which is shown as the broken line between the two. In this way, the DAC 104 is configured to generate an output signal Vdac according to the analog signal Vin. In some embodiments, the first reference voltage V1 can be a DAC reference voltage or a supply voltage, and the second reference voltage V2 can be a common mode voltage.

The processing circuit 108 is coupled between the DAC 104 and the output terminal 102, wherein the processing circuit 108 is configured to generate a digital signal Vout according to an output signal Vdac. Specifically, a loop filter 112 is coupled to the DAC 104, and is configured to generate loop filter signal LF_A based on the output signal Vdac. In some embodiments, the loop filter 112 includes a low-pass filter. The quantizer 114 is coupled to the loop filter 112, and is configured to generate a quantized signal Q_D based on the loop filter signal LF_A. The DAC 104 further generates the output signal Vdac based on the quantized signal Q_D and the analog signal Vin. The output path selection module 120 is configured to selectively couple the quantized signal Q_D to the decimation filter 116 or the integration module 118. In the embodiment illustrated in FIG. 1, i.e., under the A/D conversion operation mode, the output path selection module 120 is under the control of the switch assembly 110 and is configured such that the quantizer 114 is coupled to the decimation filter 116, which is shown as the solid line between the two, and that the quantizer 114 is not coupled to the integration module 118, which is shown as the broken line between the two. The output path selection module 120 couples the quantized signal Q_D to the decimation filter 116. In this way, the decimation filter 116 is configured to generate the digital signal Vout according to the quantized signal Q_D. The output terminal 102 is configured to output the digital signal Vout.

In some embodiments, the processing circuit 108 further includes a data weighted averaging circuit, which is coupled between the quantizer 114 and the DAC 104, and is configured to selectively conduct a plurality of D/A conversion units 104_1, 104_2, . . . 104_i, . . . 140_n based on the quantized signal Q_D.

In some other embodiments, the processing circuit 108 further includes an increasing data weighted averaging circuit, which is coupled between the quantizer 114 and the DAC 104, and is configured to selectively conduct a plurality of D/A conversion units 104_1, 104_2, . . . 104_i, . . . 140_n based on the quantized signal Q_D.

Reference is then made to FIG. 2, which is used to illustrate the measurement operation mode. FIG. 2 is similar to FIG. 1 for illustrating the A/D conversion operation mode, with the exception in the configuration of the input path selection module 106 and the configuration of the path selection module 120 in FIG. 2.

The input path selection module 106 is configured by the switch assembly 110 so that the first reference voltage V1 and the second reference voltage V2 are coupled to the DAC 104, which is shown as the solid line between the two, and the input path selection module 106 is configured so that the electric connection between the analog signal Vin and the DAC 104 is interrupted, and consequently, the DAC 104 cannot receive the analog signal Vin, which is shown as the broken line between the two. The DAC 104 resorts to generate output signal Vdac according to the first reference voltage V1 and the second reference voltage V2.

Under the measurement operation mode, the output path selection module 120 is configured by the switch assembly 110 so that the quantizer 114 is coupled to the integration module 118, and the output path selection module 120 couples the quantized signal Q_D to the integration module 118. In this way, the DAC 104, the loop filter 112, the quantizer 114 and the integration module 118 are configured as an incremental Δ-Σ ADC. The integration module 118 is configured to generate the digital signal Vout including the ratio of the capacitance of the D/A conversion unit to be measured to the total capacitance of the plurality of D/A conversion units 104_1, 104_2, ... 104_i, ... 140_n according to quantized signal Q_D.

In one embodiment, the integration module 118 includes an accumulator. In another embodiment, the integration module 118 includes a $K^{th}$-order cascade-of-integrators (COI) filter. It should be noted that the present application is not limited to the accumulator and $K^{th}$-order COI filter. In other embodiments, the integration module 118 can be implemented using other digital circuits with similar functions.

Given the operation principles of the incremental Δ-Σ ADC, the loop filter 112 and the integration module 118 are reset after obtaining the ratio of the capacitance of the first D/A conversion unit serving as the D/A conversion unit to be measured to the total capacitance of the plurality of D/A conversion units 104_1, 104_2, ... 104_i, ... 140_n. Then, the second D/A conversion unit is used as the D/A conversion unit to be measured, so as to obtain a ratio of the capacitance of the second D/A conversion unit to the total capacitance of the plurality of D/A conversion units 104_1, 104_2, ... 104_i, ... 140_n. By analogy, it is feasible to obtain the ratio of the respective capacitance of the plurality of D/A conversion units 104_1, 104_2, ... 104_i, ... 140_n to the total capacitance of the plurality of D/A conversion units 104_1, 104_2 ... 104_i ... 140_n; operation details thereof are discussed below in connection with FIG. 5 to FIG. 7.

The present disclosure can be configured as an incremental Δ-Σ ADC through the design of the output path selection module 120, and the incremental Δ-Σ ADC can in turn generate the ratio of the capacitance value of the D/A conversion unit to be measured to the total capacitance value of the plurality of D/A conversion units 104_1, 104_2, ... 104_i, ... 140_n, through the design of the input path selection module 106. In this way, it is possible to correct the mismatch errors of the plurality of D/A conversion units 104_1, 104_2, ... 104_i, ... 140_n according to the magnitude relationship of the ratios of all the D/A conversion units.

Since the incremental Δ-Σ ADC itself has the characteristics of high resolution, the ratio of the capacitance of the D/A conversion unit to be measured to the total capacitance of the plurality of D/A conversion units 104_1, 104_2, ... 104_i, ... 140_n generated by the Δ-Σ ADC 10 also has the characteristics of high resolution; also, the circuit framework of the Δ-Σ ADC 10 under the measurement operation mode is similar to the circuit framework of the Δ-Σ ADC 10 under the A/D conversion operation mode; for example, the DAC 104, the loop filter 112, and the quantizer 114 are used in both modes. Therefore, the design of the Δ-Σ ADC 10 only slightly increases the cost and does not significantly increase the parasitic capacitance. Since the parasitic capacitance does not increase significantly, it hardly affects the performance of the Δ-Σ ADC 10 when operating in the A/D conversion operation mode.

In contrast, in some conventional circuit frameworks for measuring the D/A conversion unit, additional signal sources, resistors, and voltage measuring circuit are required to measure the capacitance of the D/A conversion unit, and hence, the design is relatively complex. Also, if there is a stringent requirement for the resolution of the voltage measuring circuit, the design of the voltage measuring circuit may be more complex. Such complex design may increase the parasitic capacitance significantly, which inevitably affects the performance of the Δ-Σ ADC under the A/D conversion operation mode.

FIG. 3 is a circuit diagram illustrating an embodiment wherein the Δ-Σ ADC 10 of FIG. 1 operates in a first stage of the A/D conversion operation mode. Referring to FIG. 3, which further discloses the details of the Δ-Σ ADC 10; for example: the Δ-Σ ADC 102 includes, in addition to the plurality of D/A conversion units 104_1, 104_2, ... 104_i, ... 140_n, the switches Ø1_2 and Ø2_3; a loop filter 112, which includes amplifier 122 and a capacitor Cf forming an integrator, and a reset switch Øf, wherein the capacitor Cf and the reset switch Øf are connected in parallel between the inverting input terminal and output terminal of the amplifier 122; and an output path selection module 120, which includes switches Ø3_1 and Ø3_2, wherein the switch Ø3_1 is coupled between the quantizer 114 and the decimation filter 116, and the switch Ø3_2 is coupled between the quantizer 114 and the integration module 118. It should be noted that, in the present embodiment, only a first-order integrator is illustrated as the loop filter 112; however, the present application is not limited thereto. In some embodiments, the loop filter 112 may include a plurality of cascade integrators.

Each of the plurality of D/A conversion units 104_1, 104_2, ... 104_i, ... 140_n includes switches Ø1_1, Ø2_1, Ø2_2, D_1 and D_2, and a capacitor. To distinguish among the respective capacitor of the plurality of D/A conversion units 104_1, 104_2, ... 104_i, ... 140_n, the capacitor of the D/A conversion unit 104_1 is named Cs1, the capacitor of the D/A conversion unit 104_2 is named Cs2, the capacitor of the D/A conversion unit 104_i is named Csi, the capacitor of the D/A conversion unit 104_n is named Csn, and so on.

Take the D/A conversion unit 104_1 for example, the switch Ø1_1 is coupled between the input path selection module 106 and one terminal of the capacitor Cs1; the switches D_1 and Ø2_1 are connected in series between one terminus of the capacitor Cs1 and the first reference voltage V1; and, the switches D_2 and Ø2_2 are connected in series between one terminus of the capacitor Cs1 and the third reference voltage V3. The other D/A conversion units 104_2, ... 104_n have similar circuit structures, and hence a detailed description thereof is omitted herein for the sake of brevity. In some embodiments, the third reference voltage includes a ground voltage.

The switch Ø1_2 is coupled between the other terminus of each of the plurality of capacitors Cs1, Cs2, . . . , Csi, . . . Csn and the second reference voltage. The switch Ø2_3 is coupled between the other terminus of each of the plurality of capacitors Cs1, Cs2, . . . , Csi, . . . Csn and the inverting input terminal of the amplifier 122.

Under the A/D conversion operation mode of the Δ-Σ ADC 10, the switch Ø3_1 of the output path selection module 120 is conducted, whereas the switch Ø3_2 of the output path selection module 120 is not conducted. In this way, the quantized signal Q_D is electrically connected to the DAC 116. Therefore, the DAC 116 performs the A/D conversion according to the quantized signal Q_D so as to obtaine the digital signal Vout by conversion.

In the first stage, the switches Ø1_1 and Ø1_2 are conducted, whereas the switches Ø2_1, Ø2_2, Ø2_3 are not conducted. The input path selection module 106 couples each unit input terminal of the plurality of D/A conversion units 104_1, 104_2, . . . 104_i, . . . 140_n to the input terminal 100 through the conducted switch Ø1_1, so as to receive the analog signal Vin, thereby sampling the analog signal Vin. Specifically, one terminus of each of the plurality of capacitors Cs1, Cs2, . . . Csi, . . . Csn receives the analog voltage Vin via the conducted switch Ø1_1, whereas the other terminus of each of the plurality of capacitors Cs1, Cs2, . . . Csi, . . . Csn receives the second reference voltage V2 via the conducted switch Ø1_2. Therefore, each of the plurality of capacitors Cs1, Cs2, . . . Csi, . . . Csn has a cross-voltage (Vin-V2), and as a result, charges (hereinafter, charges to be distributed) are accumulated therein.

Figure 4:
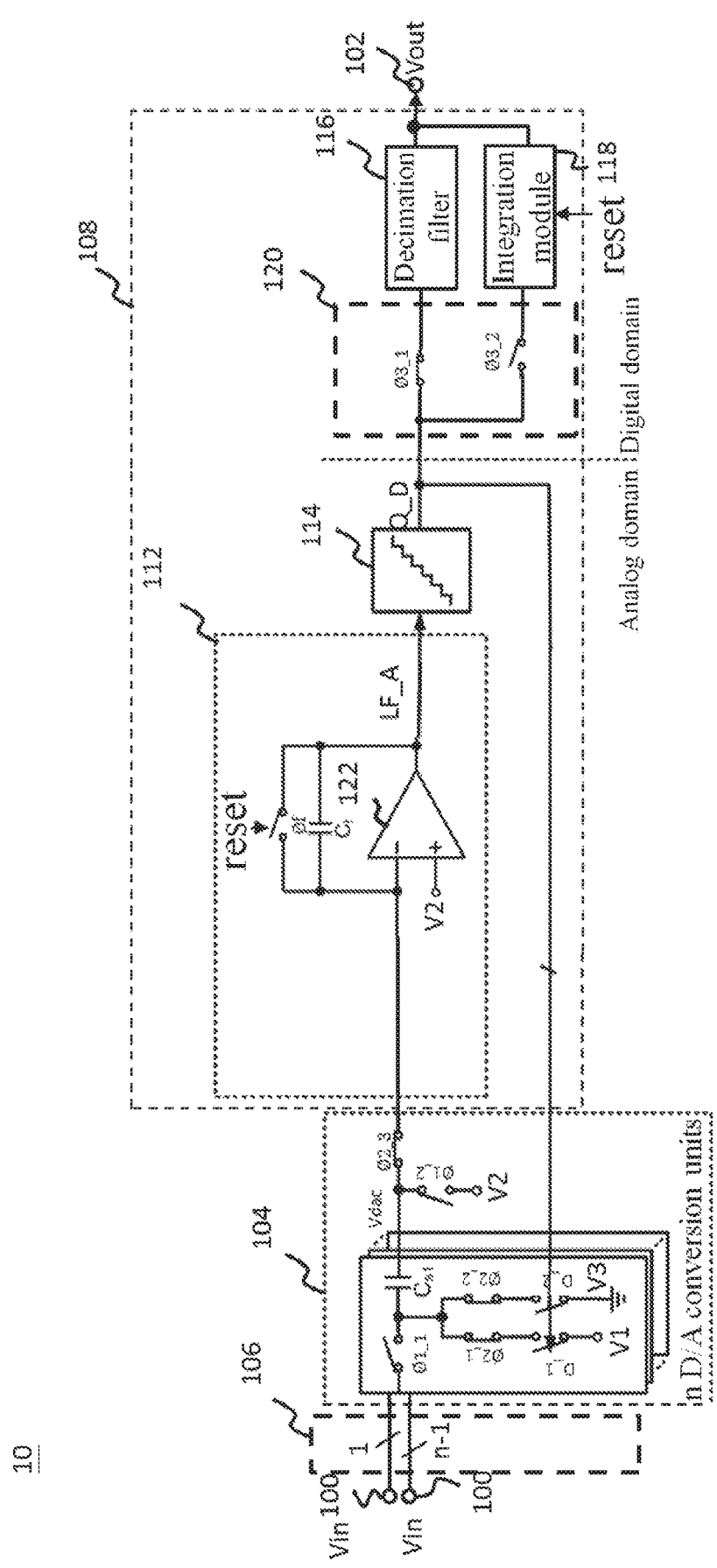
FIG. 4 is a circuit diagram relative to FIG. 3 and illustrating an embodiment wherein the Δ-Σ ADC operates in a second stage of the A/D conversion operation mode.

FIG. 4 is a circuit diagram relative to FIG. 3 and illustrating an embodiment wherein the Δ-Σ ADC operates in a second stage of the A/D conversion operation mode. Referring to FIG. 4, the switches Ø1_1 and Ø1_2 are not conducted, whereas the switches Ø2_1, Ø2_2 and Ø2_3 are conducted, and the other terminus of each of the plurality of capacitors Cs1, Cs2, . . . Csi, . . . Csn electrically connects to the inverting input terminal of the amplifier 122, wherein the non-inverting input terminal of the amplifier receives the second reference voltage V2. Given the operation principles of the Δ-Σ ADC, the switch D_1 of the selected D/A conversion unit among the plurality of D/A conversion units 104_1, 104_2 . . . 104_i . . . 140_n is conducted, and the switch D_2 thereof is not conducted, so that the one terminus of the capacitor of the selected D/A conversion unit receives the first reference voltage V1, whereas the switch D_1 of the D/A conversion unit that is not selected among the plurality of D/A conversion units 104_1, 104_2 . . . 104_i . . . 140_n is not conducted, and the switch D_2 thereof is conducted, so that one terminus of the capacitor of the non-selected D/A conversion unit receives the third reference voltage V3.

Therefore, the charges to be distributed stored in each of the plurality of capacitors Cs1, Cs2, . . . Csi, . . . Csn in the first stage would be distributed to the Cf of the loop filter 112 and the plurality of capacitors Cs1, Cs2, . . . Csi, . . . Csn in the second stage. In this way, the Δ-Σ ADC 10 converts the analog signal Vin into the digital signal Vout.

Figure 5:
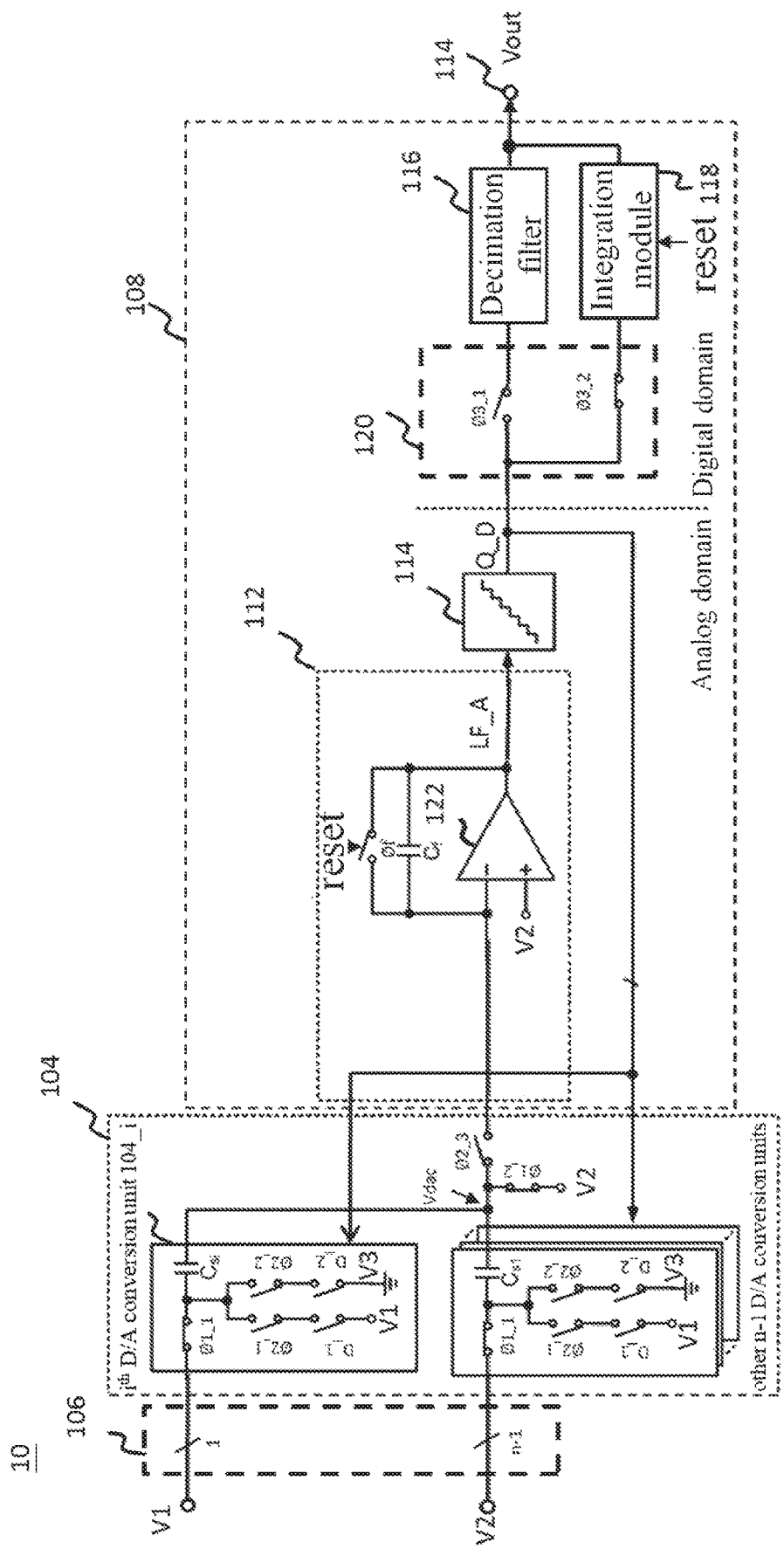
FIG. 5 is a circuit diagram relative to FIG. 3 and illustrating an embodiment wherein the Δ-Σ ADC operates in a first stage of the measurement operation mode.

FIG. 5 is a circuit diagram relative to FIG. 3 and illustrating an embodiment wherein the Δ-Σ ADC operates in a first stage of the measurement operation mode. The measurement operation mode of the Δ-Σ ADC 10 also includes a first stage and a second stage that operate alternatingly. Referring to FIG. 5, under the measurement operation mode of the Δ-Σ ADC 10, the switch Ø3_1 of the output path selection module 120 is not conducted, whereas the switch Ø3_2 of the output path selection module 120 is conducted. In this way, the quantized signal Q_D electrically connects to the integration module 118. In this way, the Δ-Σ ADC 10 is configured as an incremental Δ-Σ ADC. The integration module 118 generates the digital signal Vout according to the quantized signal Q_D.

In the first stage, the switches Ø1_1 and Ø1_2 are conducted, whereas the switches Ø2_1, Ø2_2, Ø2_3 are not conducted. The input path selection module 106 couples the unit input terminal of the D/A conversion unit to be measured 104_i of the plurality of D/A conversion units 104_1, 104_2, . . . 104_i, . . . 140_n via the conducted switch Ø1_1 to the first reference voltage V1, and couples the unit input terminal of the D/A conversion units of the plurality of D/A conversion units 104_1, 104_2, . . . 104_i, . . . 140_n to the second reference voltage V2. Further, each unit output terminal of the plurality of D/A conversion units 104_1, 104_2, . . . 104_i, . . . 140_n is coupled to the second reference voltage V2, and the D/A conversion unit to be measured 104_i stores the charge to be distributed based on the first reference voltage V1 and the second reference voltage V2. Specifically, one terminus of the capacitor Csi of the D/A conversion unit to be measured 104_i receives the first reference voltage V1 via the conducted switch Ø1_1, and the other terminus of the capacitor Csi of the D/A conversion unit to be measured 104_i receives the second reference voltage V2 via the conducted switch Ø1_2. Therefore, the capacitor Csi of the D/A conversion unit to be measured 104_i has a V1-V2 cross-voltage, and as a result, charges (hereinafter, charges to be distributed) are accumulated therein.

In contrast, one terminus of the capacitor of each of the other D/A conversion units receives the second reference voltage V2 via the conducted switch Ø1_1, and the other terminus of the capacitor of each of the other D/A conversion units receives the second reference voltage V2 via the conducted switch Ø1_2. Since the cross-voltage is 0, the capacitors of the other D/A conversion units do not accumulate charges therein.

Figure 6:
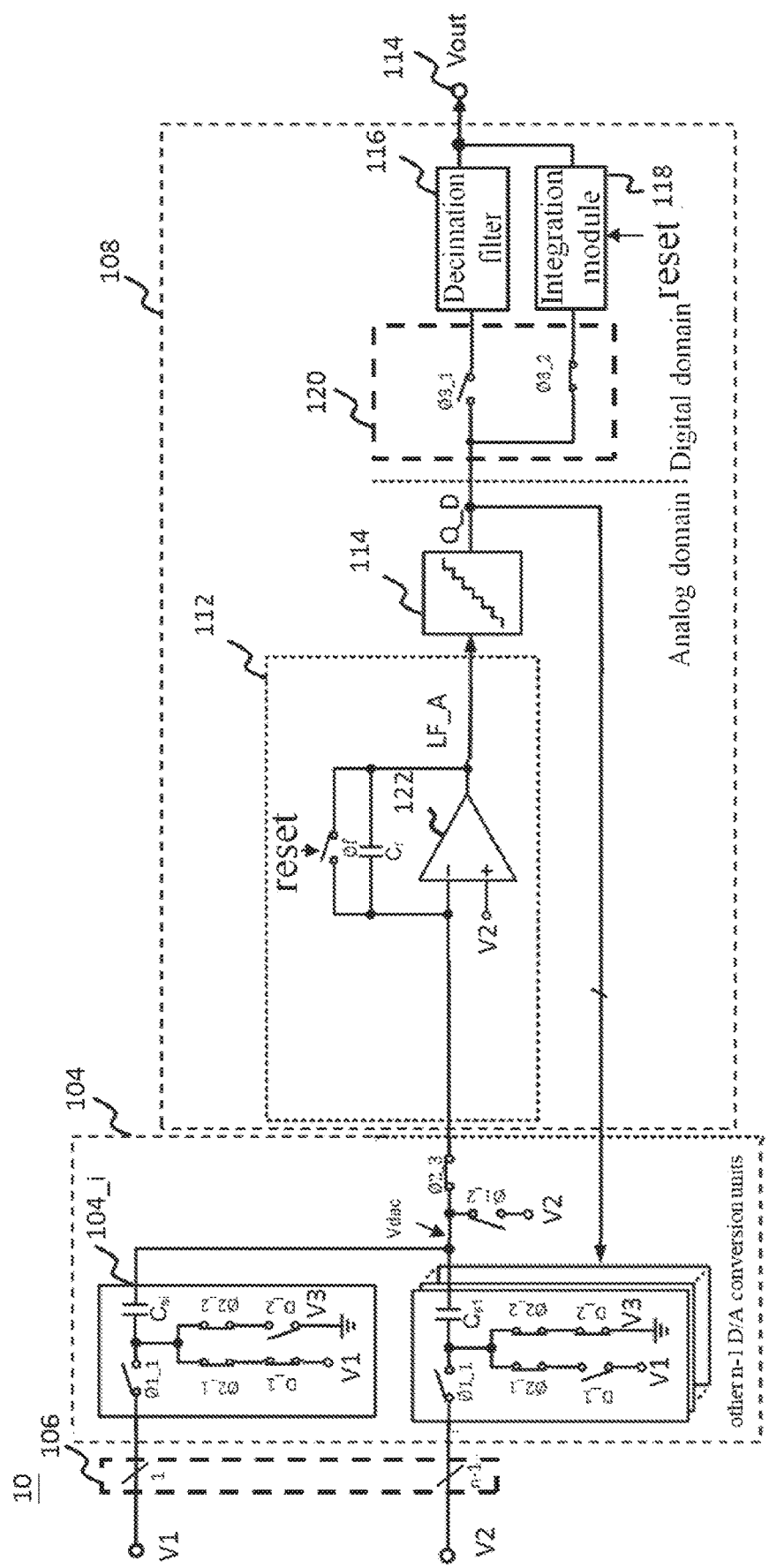
FIG. 6 is a circuit diagram relative to FIG. 5 and illustrating an embodiment wherein the Δ-Σ ADC operates in a second stage of the measurement operation mode.

FIG. 6 is a circuit diagram relative to FIG. 5 and illustrating an embodiment wherein the Δ-Σ ADC operates in a second stage of the measurement operation mode. Referring to FIG. 6, the switches Ø1_1 and Ø1_2 are not conducted, whereas the switches Ø2_1, Ø2_2, Ø2_3 are conducted, and the other terminus of each of the plurality of capacitors Cs1, Cs2, . . . Csi, . . . Csn electrically connects to the inverting input terminal of the amplifier 122. Given the operation principles of the Δ-Σ ADC, the switch D_1 of the selected D/A conversion unit among the plurality of D/A conversion units 104_1, 104_2, . . . 104_i, . . . 140_n is conducted, and the switch D_2 thereof is not conducted, so that the one terminus of the capacitor of the selected D/A conversion unit receives the first reference voltage V1, whereas the switch D_1 of the D/A conversion unit that is not selected among the plurality of D/A conversion units 104_1, 104_2, . . . 104_i, . . . 140_n is not conducted, and the switch D_2 thereof is conducted, so that one terminus of the capacitor of the non-selected D/A conversion unit receives the third reference voltage V3.

Take the embodiment of FIG. 6 for example, the D/A conversion unit to be measured 104_i is selectively conducted. The switch D_1 of the D/A conversion unit to be measured 104_i is conducted, whereas the switch D_2 is not conducted. Therefore, the capacitor Csi has a V1-V2 cross-voltage, and as a result, charges (hereinafter, charges to be distributed) are accumulated therein. The other n-1 D/A conversion units are not selectively conducted. The switch D_1 of the other n-1 D/A conversion units is not conducted, whereas the switch D_2 is conducted. Therefore, the capacitors of the other n-1 D/A conversion units has a V3-V2 cross-voltage, and as a result, charges (hereinafter, charges to be distributed) are accumulated therein. In the present embodiment, it happens that only one D/A conversion unit is selectively conducted; however, the present application is not limited thereto. In some embodiments, a plurality of D/A conversion units may be selectively conducted. Also, in the present embodiment, it happens that the D/A conversion unit to be measured 104_i is selectively conducted; however, the present application is not limited thereto. In some embodiments, the D/A conversion unit that is selectively conducted may not include the D/A conversion unit to be measured 104_i.

Therefore, the charges to be distributed stored in the capacitor Csi of D/A conversion unit to be measured 104_i in the first stage would be distributed to the Cf of the loop filter 112 and the plurality of capacitors Cs1, Cs2, . . . Csi, . . . Csn in the second stage, so that the digital signal Vout is obtained, wherein the digital signal Vout is related to the ratio of the capacitance of the capacitor Csi of the D/A conversion unit to be measured 104_i to the total capacitance of the plurality of capacitors Cs1, Cs2, . . . Csi, . . . Csn of the plurality of D/A conversion units 104_1, 104_2, . . . 104_i, . . . 140_n. In some embodiments, it is feasible to repeat the first stage of FIG. 5 and the second stage of FIG. 6 on the D/A conversion unit to be measured 104_i, so as to obtain a more accurate ratio.

After obtaining the ratio related to the capacitor of the D/A conversion unit to be measured 104_i, it is feasible to perform the first stage of FIG. 5 and the second stage of FIG. 6 on D/A conversion unit of the plurality of D/A conversion units 104_1, 104_2, . . . 104_i, . . . 140_n other than the D/A conversion unit to be measured 104_i. However, before performing the first stage of FIG. 5 and the second stage of FIG. 6 once again, the Δ-Σ ADC 10 should be reset to clear the accumulated charges.

Figure 7:
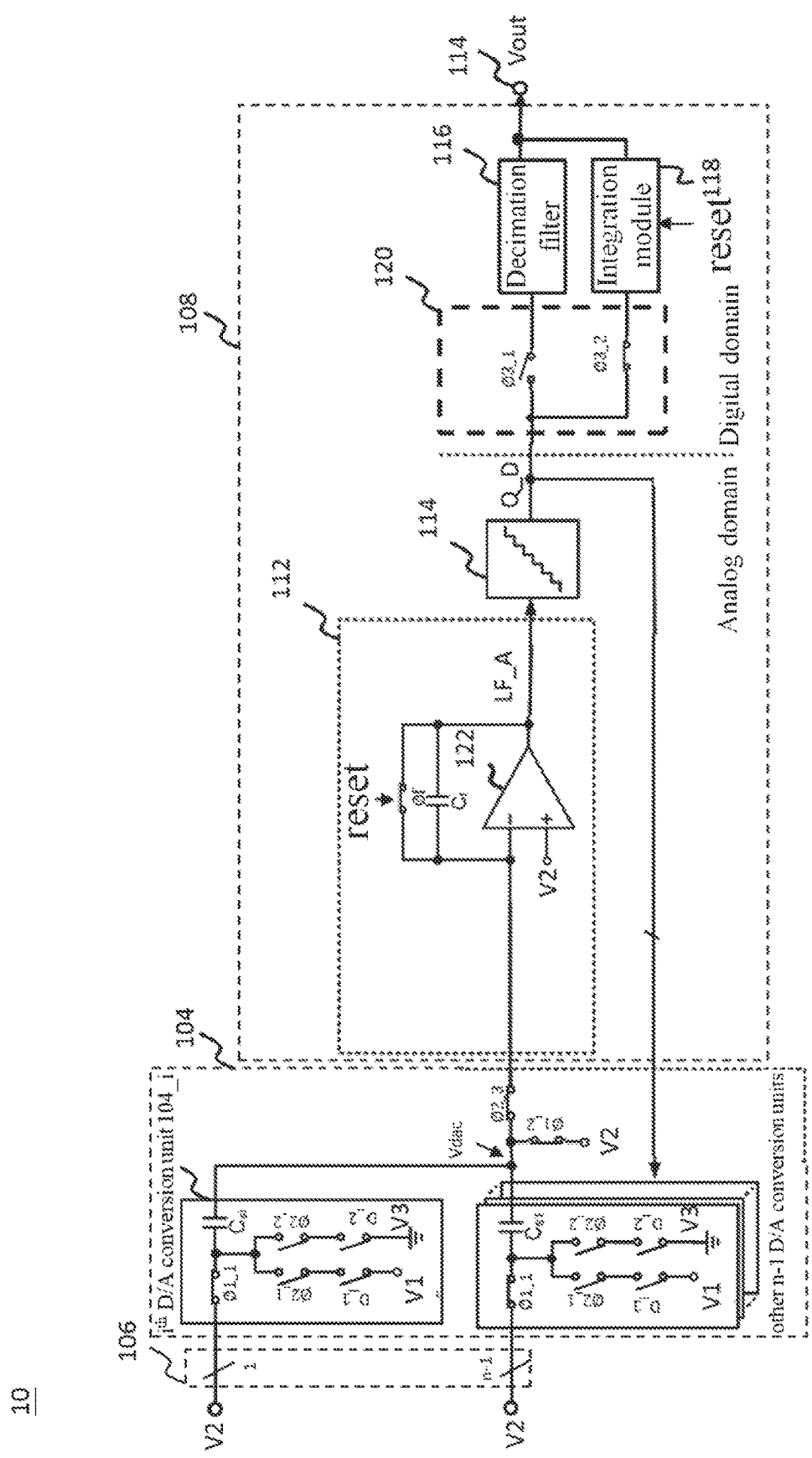
FIG. 7 is a circuit diagram relative to FIG. 6 and illustrating the embodiment wherein the Δ-Σ ADC is reset.

FIG. 7 is a circuit diagram relative to FIG. 6 and illustrating the embodiment wherein the Δ-Σ ADC is reset. Referring to FIG. 7, the loop filter 112 and the integration module 118 have the reset function. When the Δ-Σ ADC operates under the measurement operation mode, the first D/A conversion unit among the plurality of D/A conversion units 104_1, 104_2, . . . 104_i, . . . 140_n, for example, the D/A conversion unit 104_i, is used as the D/A conversion unit to be measured, and after obtaining the digital signal Vout including the ratio by conversion, the loop filter 112 and the integration module 118 are reset, and then a second D/A conversion unit among the plurality of D/A conversion units 104_1, 104_2, . . . 104_i, . . . 140_n, for example, the D/A conversion unit 104_j, is used as the D/A conversion unit to be measured. It should be noted that i is any number between 1 to n, whereas j is any number between 1 to n and is different from and i.

In this embodiment, the loop filter 112 is reset by conducting the reset switch Øf. After the reset switch Øf is conducted, the capacitor Cf is bypassed, and therefore, the potential of the inverting input terminal of the amplifier 122 is the same as the potential of the output terminal of the amplifier 122, because the virtual short circuit of the inverting input terminal of the amplifier 122 to the non-inverting input, and both are the second reference voltage V2.

The input path selection module 106 is configured to interrupt the electrical connection between the first reference voltage V1 and the analog signal Vin and the DAC 104, and the second reference voltage V2 is coupled to the DAC 104. Also, the switches Ø1_1 and Ø1_2 are conducted. The input path selection module 106 couples the second reference voltage V2 to one terminal of the plurality of capacitors Cs1, Cs2, . . . Csi, . . . Csn via the conducted switch Ø1_1. The second reference voltage V2 is coupled to the other terminus of the plurality of capacitors Cs1, Cs2, . . . Csi, . . . Csn via the conducted switch Ø1_2. In this way, the plurality of capacitors Cs1, Cs2, . . . Csi, . . . Csn are reset because the cross-voltage thereof is 0.

By repeating the procedures set forth in FIG. 5 to FIG. 7, it is feasible to obtain the respective ratio of the capacitance of each of the plurality of capacitors Cs1, Cs2, . . . Csi, . . . Csn of the plurality of D/A conversion units 104_1, 104_2, . . . 104_i, . . . 140_n to the total capacitance of the plurality of capacitors Cs1, Cs2, . . . Csi, . . . Csn. In this way, it is possible to correct the mismatch errors of the plurality of D/A conversion units 104_1, 104_2, . . . 104_i, . . . 140_n according to the magnitude relationship of the ratios of all the D/A conversion units.

In some embodiments, the above-mentioned Δ-Σ ADC 10 can be implemented using a semiconductor process, for example, the present application further provides a chip, which includes the Δ-Σ ADC 10, and the chip can be a semiconductor chip implemented using different process.

The foregoing outlines features of several embodiments so that those skilled in the art may better understand various aspects of the present disclosure. Those skilled in the art should appreciate that they may readily use the present disclosure as a basis for designing or modifying other processes and structures for carrying out the same purposes and/or achieving the same advantages of embodiments introduced herein. Those skilled in the art should also realize that such equivalent embodiments still fall within the spirit and scope of the present disclosure, and they may make various changes, substitutions, and alterations thereto without departing from the spirit and scope of the present disclosure.

What is claimed is:

1. An analog-to-digital converter (ADC), having an analog-to-digital (A/D) conversion operation mode and a measurement operation mode, wherein the ADC comprises:
   an input terminal, configured to receive an analog signal;
   an output terminal, configured to output a digital signal;
   a digital-to-analog converter (DAC), comprises a plurality of digital-to-analog (D/A) conversion units, respectively having a unit input terminal and a unit output terminal, wherein the unit output terminals of the plurality of D/A conversion units are coupled to one another, and the plurality of D/A conversion units generates an output signal according to the unit input terminals of the plurality of D/A conversion units;
   an input path selection module, coupled between the input terminal and the DAC, wherein when the ADC operates in the measurement operation mode, the input path selection module couples the unit input terminal of a D/A conversion unit to be measured among the plurality of D/A conversion units to a first reference voltage, and couples the unit input terminals of the other D/A conversion units among the plurality of D/A conversion units to a second reference voltage; and
   a processing circuit, coupled between the DAC and the output terminal, wherein the processing circuit is configured to generate the digital signal according to the output signal, wherein the processing circuit includes:
      a loop filter, coupled to the DAC, and generating a loop filter signal based on the output signal;
      a quantizer, configured to generate a quantized signal based on the loop filter signal;

a decimation filter, configured to generate the digital signal according to the quantized signal;

an integration module, configured to generate the digital signal including a ratio according to the quantized signal; and an output path selection module, configured to selectively couple the quantized signal to the decimation filter or the integration module;

wherein when the ADC operates in the A/D conversion operation mode, the ADC is configured to convert the analog signal into the digital signal, and when the ADC operates in the measurement operation mode, the digital signal is related to the ratio of a capacitance of the D/A conversion unit to be measured to a total capacitance of the plurality of D/A conversion units.

2. The ADC of claim 1, wherein when the ADC operates in the measurement operation mode, each unit output terminal of the plurality of D/A conversion units is coupled to the second reference voltage, and the D/A conversion unit to be measured stores charges to be distributed based on the first reference voltage and the second reference voltage.

3. The ADC of claim 2, wherein when the ADC operates in the measurement operation mode, the other D/A conversion units are free from storing charges.

4. The ADC of claim 1, wherein when the ADC operates in the A/D conversion operation mode, the output path selection module couples the quantized signal to the decimation filter, and when the ADC operates in the measurement operation mode, the output path selection module couples the quantized signal to the integration module.

5. The ADC of claim 1, wherein the loop filter comprises a low-pass filter.

6. An analog-to-digital converter (ADC), having an analog-to-digital (A/D) conversion operation mode and a measurement operation mode, wherein the ADC comprises:

an input terminal, configured to receive an analog signal;

an output terminal, configured to output a digital signal;

a digital-to-analog converter (DAC), comprises a plurality of digital-to-analog (D/A) conversion units, respectively having a unit input terminal and a unit output terminal, wherein the unit output terminals of the plurality of D/A conversion units are coupled to one another, and the plurality of D/A conversion units generates an output signal according to the unit input terminals of the plurality of D/A conversion units;

an input path selection module, coupled between the input terminal and the DAC, wherein when the ADC operates in the measurement operation mode, the input path selection module couples the unit input terminal of a D/A conversion unit to be measured among the plurality of D/A conversion units to a first reference voltage, and couples the unit input terminals of the other D/A conversion units among the plurality of D/A conversion units to a second reference voltage; and a processing circuit, coupled between the DAC and the output terminal, wherein the processing circuit is configured to generate the digital signal according to the output signal wherein when the ADC operates in the A/D conversion operation mode, the ADC is configured to convert the analog signal into the digital signal, and when the ADC operates in the measurement operation mode, the digital signal is related to a ratio of a capacitance of the D/A conversion unit to be measured to a total capacitance of the plurality of D/A conversion units; and wherein the loop filter and the integration module have a reset function, and when the ADC operates in the measurement operation mode, a first D/A conversion unit of the plurality of D/A conversion units is used as the D/A conversion unit to be measured, and after obtaining the digital signal comprising the ratio by conversion, the loop filter and the integration module are reset, and then a second D/A conversion unit of the plurality of D/A conversion units is used as the D/A conversion unit to be measured.

7. The ADC of claim 6, wherein the loop filter comprises:

an integrator, comprising a capacitor; and a reset switch, connected in parallel with the capacitor, wherein the loop filter is reset by conducting the reset switch.

8. The ADC of claim 1, wherein each of the plurality of D/A conversion units comprises a capacitor, and the measurement operation mode comprises a first stage and a second stage that operate alternatingly, wherein in the first stage, the D/A conversion unit to be measured stores the charges to be distributed by coupling the capacitor of the D/A conversion unit to be measured between the first reference voltage and the second reference voltage, and in the second stage, re-distributing the charges to be distributed to the respective capacitor of the plurality of D/A conversion units by coupling one terminal of the respective capacitor of the plurality of D/A conversion units to the second reference voltage, and coupling the other terminal of the respective capacitor of the plurality of D/A conversion units to the first reference voltage or the third reference voltage.

9. The ADC of claim 8, wherein the second reference voltage is a common mode voltage, and the third reference voltage is a ground voltage.

10. The ADC of claim 1, wherein the processing circuit further comprises:

a data weighted averaging circuit, coupled between the quantizer and the DAC, and configured to selectively conduct the plurality of D/A conversion units based on the quantized signal.

11. The ADC of claim 1, wherein the processing circuit further comprises:

an increasing data weighted averaging circuit, coupled between the quantizer and the DAC, and configured to selectively conduct the plurality of D/A conversion units based on the quantized signal.

12. A chip, comprising: an ADC, having an analog-to-digital (A/D) conversion operation mode and a measurement operation mode, wherein the ADC includes:

an input terminal, configured to receive an analog signal;

an output terminal, configured to output a digital signal;

a digital-to-analog converter (DAC), comprises a plurality of digital-to-analog (D/A) conversion units, respectively having a unit input terminal and a unit output terminal, wherein the unit output terminals of the plurality of D/A conversion units are coupled to one another, and the plurality of D/A conversion units generates an output signal according to the unit input terminals of the plurality of D/A conversion units;

an input path selection module, coupled between the input terminal and the DAC, wherein when the ADC operates in the measurement operation mode, the input path selection module couples the unit input terminal of a D/A conversion unit to be measured among the plurality of D/A conversion units to a first reference voltage, and couples the unit input terminals of the other D/A conversion units among the plurality of D/A conversion units to a second reference voltage; and a processing circuit, coupled between the DAC and the output terminal, wherein the processing circuit is configured to generate the digital signal according to the output signal, wherein the processing circuit includes:
   a loop filter, coupled to the DAC, and generating a loop filter signal based on the output signal;
   a quantizer, configured to generate a quantized signal based on the loop filter signal;
   a decimation filter, configured to generate the digital signal according to the quantized signal;
   an integration module, configured to generate the digital signal including a ratio according to the quantized signal; and
   an output path selection module, configured to selectively couple the quantized signal to the decimation filter or the integration module;
wherein when the ADC operates in the A/D conversion operation mode, the ADC is configured to convert the analog signal into the digital signal, and when the ADC operates in the measurement operation mode, the digital signal is related to the ratio of a capacitance of the D/A conversion unit to be measured to a total capacitance of the plurality of D/A conversion units.

* * * * *